United States Patent [19]

Nakamura et al.

[11] Patent Number: 4,960,972
[45] Date of Patent: Oct. 2, 1990

[54] LIGHT-BEAM-OPERATED HEATING MACHINE

[75] Inventors: Masaaki Nakamura; Tsutomu Yasuoka, both of Saitama, Japan

[73] Assignee: Pioneer Electronic Corporation, Tokyo, Japan

[21] Appl. No.: 382,887

[22] Filed: Jul. 21, 1989

[30] Foreign Application Priority Data

Jan. 12, 1989 [JP] Japan ................................. 01-5643

[51] Int. Cl.$^5$ ............................................. B23K 1/005
[52] U.S. Cl. .................................................. 219/85.12
[58] Field of Search ........... 219/85.12, 121.73, 121.74, 219/121.75

[56] References Cited

U.S. PATENT DOCUMENTS 3,632,955 1/1972 Cruickshank ................. 219/85.12
3,718,800 2/1973 Costello ......................... 219/85.12
3,805,019 4/1974 Gorishek ........................ 219/85.12

FOREIGN PATENT DOCUMENTS 62-3269 1/1987 Japan .
62-113866 7/1987 Japan .

Primary Examiner—Clifford C. Shaw
Attorney, Agent, or Firm—Sughrue, Mion, Zinn, Macpeak & Seas

[57] ABSTRACT

A light-beam-operated heating apparatus for concentrating light into a focussed line of light for soldering or the like. The apparatus forms multiple beams from a single source; each beam having a non-uniform intensity along a first axis which is in a plane perpendicular to the optical axis of the apparatus. The beam is concentrated by a concentrator lens along a second axis in the same plane as and perpendicular to said first axis, thereby forming a line of light which has non-uniform intensity along the line. A diffuser is positioned to intercept the beam and defuse the light beam along said first axis, thereby reducing the non-uniformity of the light intensity.

5 Claims, 4 Drawing Sheets

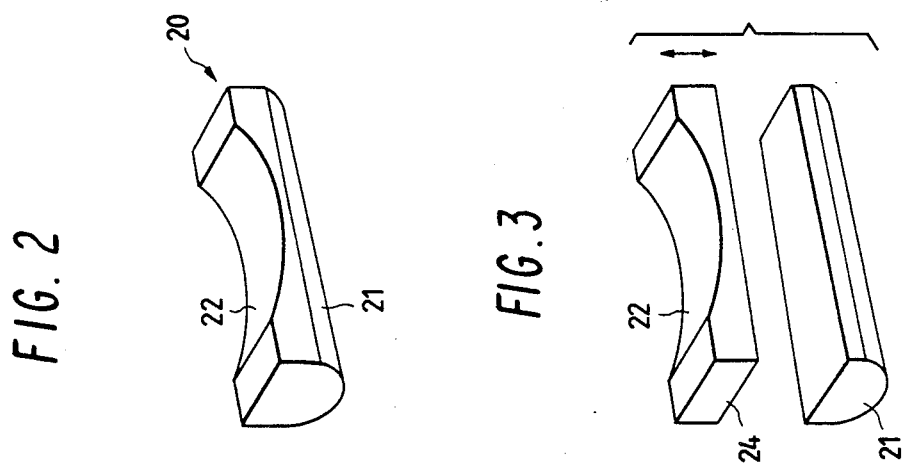
FIG. 2
FIG. 3
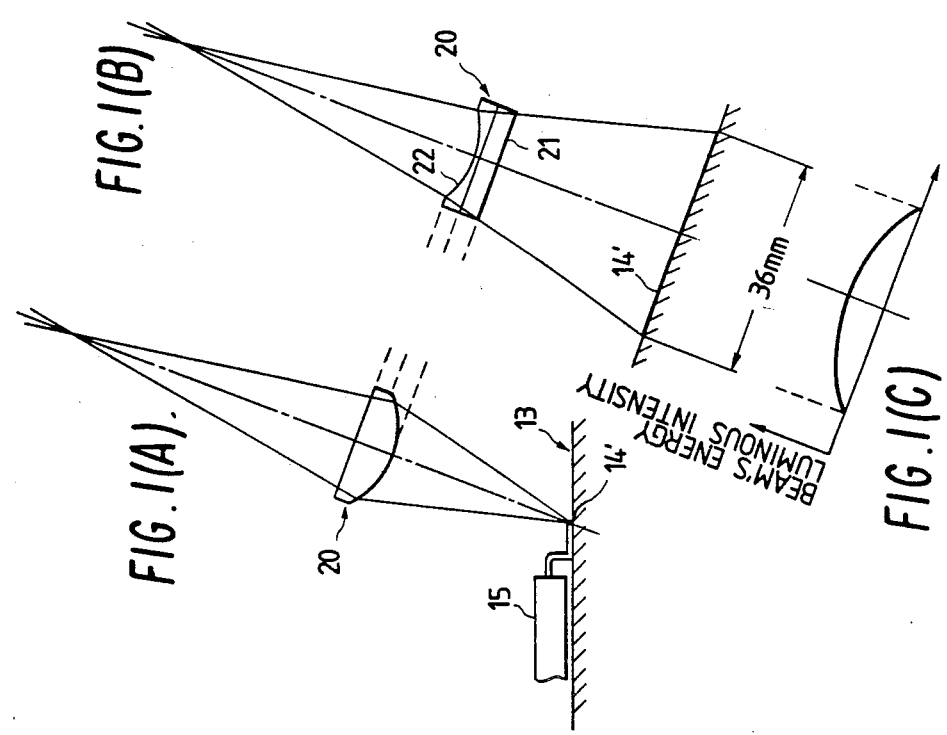
FIG. 1(A)
FIG. 1(B)
FIG. 1(C)

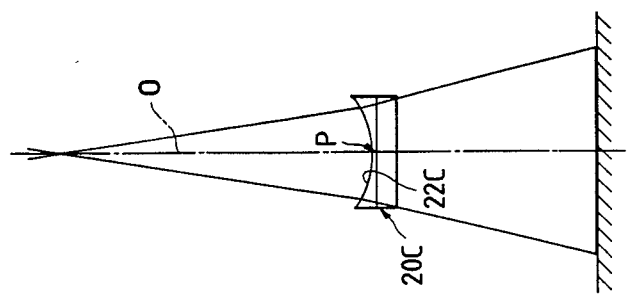
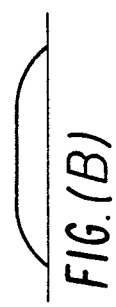
FIG.6(A)  FIG.(B)
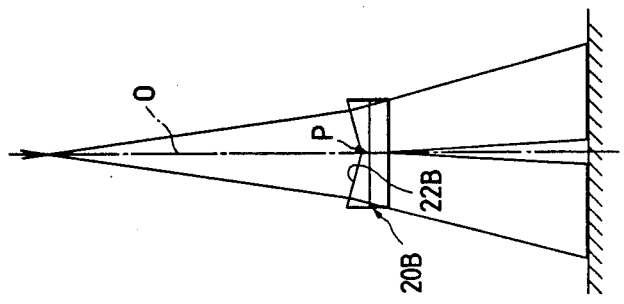
FIG.5(A)  FIG.(B)
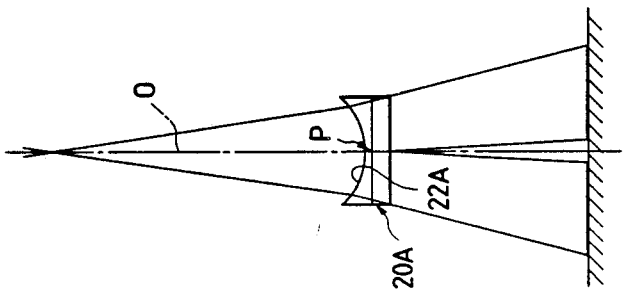
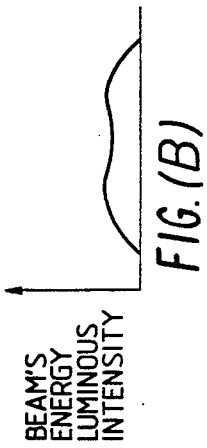
FIG.4(A)  FIG.(B)
BEAM'S ENERGY LUMINOUS INTENSITY

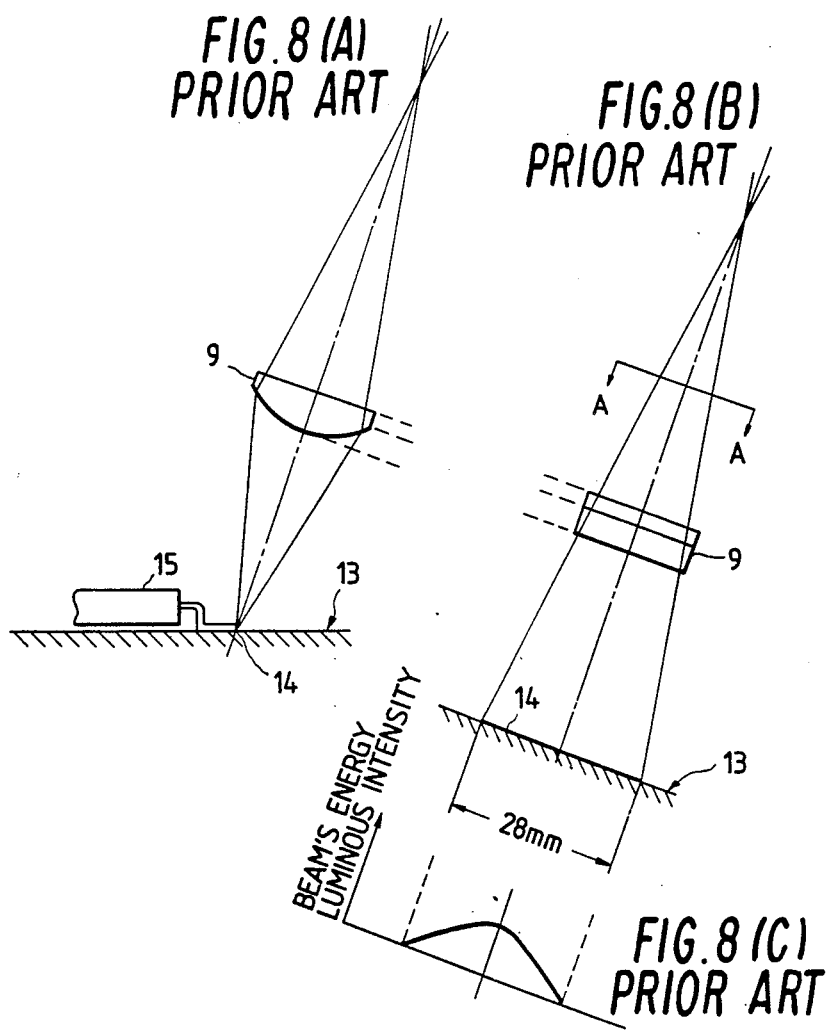
FIG. 8(A) PRIOR ART
FIG. 8(B) PRIOR ART
FIG. 8(C) PRIOR ART
FIG. 9 PRIOR ART
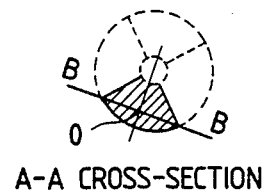
A-A CROSS-SECTION

LIGHT-BEAM-OPERATED HEATING MACHINE

BACKGROUND OF THE INVENTION

This invention relates to light-beam-operated heating machines, and more particularly to a light-beam-operated heating machine in which the radiation heat of a light beam is utilized to melt solder, thereby to solder, a workpiece such as an electronic component.

Examples of the above-described machines are heating machines disclosed for instance by Japanese Utility Model Application Unexamined Publication Nos. 3269/1987 and 113866/1987. One example of the arrangement of the heating machines is as shown in FIG. 7. In FIG. 7, reference numeral 1 designates an arc heat light source lamp having a point light source 2. The light source lamp is so arranged that its point light source 2 is positioned at or near the first focal point of an elliptical mirror 3. The light source lamp 1 has an anode 4 and a cathode 5 across which a supply voltage is applied by a lamp power source (not shown) to excite the point light source 2. The art heat light source lamp 1, is for instance a short arc type xenon lamp.

A thermal light beam emitted from the point light source 2 is reflected by the elliptical mirror 3. The light beam thus reflected is further reflected by a first plane mirror 6' and then by a second plane mirror 7. The angle of the first plane mirror 6 and the position of the second mirror 7 can be precisely adjusted. For instance the position of the second plane mirror 7 in a horizontal direction can be precisely adjusted by an adjusting mechanism 8. A cylindrical lens 9 is disposed in the path of the light beam reflected from the second plane mirror 7. The lens 9 is held at a predetermined angle, and its position in a horizontal direction can be precisely adjusted by an adjusting mechanism 10.

A light intercepting board 11 is provided in the path of the light beam reflected from the second plane mirror 7 and on the light incident side of the cylindrical lens 9. Each light intercepting board 11 is made up of two plates arranged along the longitudinal direction of the cylindrical lens 9. The distance between the two plates is controlled by a distance adjusting mechanism 12 so as to change the width of the light beam applied to the cylindrical lens 9.

An optical system comprising the above-described first plane mirror 6, second plane mirror 7, adjusting mechanisms 8 and 10, cylindrical lens 9 and light intercepting board 11 is provided in each of four quadrants surrounding the central axis of the elliptical mirror 3. Only two such optical systems are shown in the cross-sectional drawing, which is FIG. 1.

In the heating apparatus thus constructed the thermal light beam emitted radially from the point light source 2, being reflected by the elliptical mirror 3, forms a certain light concentrating path (a). and it is reflected in four directions by the four first plane mirrors 6 arranged in the form of a quadrangular pyramid, thus forming four optical paths (b). The light beams on the optical paths (b) are reflected by the second plane mirrors 7 to form optical paths (c). thus being applied to the cylindrical lenses 9. Each of the light beams is concentrated by the respective cylindrical lens 9 into a respective focused line of light 14 also referred to as a linear spot 14. The four linear light spots 14 are focused onto a printed circuit board 13. The linear light spots are applied near the lead wires of electronic components 15 which constitute workpieces. Since the portions of the printed circuit board which are to be irradiated by the light spots have been coated with solder in advance the solder is melted by the radiation heat of the light spots 14, whereby the lead wires are soldered to the printed circuit board.

In the light-beam-operated heating machine described above, the single light beam obtained by concentrating the output light beam of the point light source 1 with the elliptical mirror 3 is divided into four light beams with the four first plane mirrors 6 in a plane perpendicular to the optical axis of the single light beam, and the four light beams thus formed are applied to the cylindrical lenses 9 by means of the second plane mirrors 7.

FIG. 8 illustrates a front view (part A) of the conventional light concentrating optical system, a side view (part B) of the system, and a graph (part C) of the light energy distribution intensity in the longitudinal direction of the linear light spot (line of light) 14. FIG. 9 is a view across the light beam upstream of the lens 9 in the cross section A—A in FIG. 8. The line B—B in FIG. 9 represents the longitudinal direction of the linear light spot. When concentrated by lens 9 into a single line on the printed circuit board 13, the intensity varies as shown in part C of FIG. 8. In fact, the middle of the focused line of light is excessively different from that at the ends.

SUMMARY OF THE INVENTION

Accordingly, an object of this invention is to eliminate the above-described difficulties accompanying a conventional light-beam-operated heating machine. More specifically an object of the invention is to provide a light-beam-operated heating machine in which the beam's energy luminous intensity difference in the longitudinal direction of each linear light spot is minimized, whereby the energy distribution is made uniform to the extent that it is substantially practical in use.

In the light-beam-operated heating machine according to the invention, when at least one light beam non-uniform in intensity distribution in one direction in a plane perpendicular to the optical axis thereof is concentrated in a direction perpendicular to the one direction to form a linear light spot, the light beam is diffused in the one direction by diffusing means.

BRIEF DESCRIPTION OF THE DRAWINGS

FIG. 1 is a diagram showing one example of a light concentrating optical system to which the technical concept of this invention is applied. More specifically, the parts (A) and (B) of FIG. 1 are a front view and a side view of the light concentrating optical system, respectively, and the part (C) of FIG. 1 is a diagram showing the energy distribution in the longitudinal direction of a linear light spot.

FIG. 2 is a perspective view showing an optical component employed in the light concentrating optical system.

FIG. 3 is a perspective view showing one modification of the optical component shown in FIG. 2.

FIGS. 4, 5 and 6 show the arrangements of other examples of the light concentrating optical system to which the technical concept of the invention is applied. More specifically, the parts (A) of FIGS. 4, 5 and 6 are side views of the light concentrating optical systems, respectively, and the parts (B) of FIGS. 4, 5 and 6 are diagrams showing energy distributions in the longitudinal directions of the linear light spots, respectively.

FIG. 8 shows the arrangement of a conventional light concentrating optical system. More specifically, the parts (A) and (B) of FIG. 8 are a front view and a side view of the conventional light concentrating optical system, respectively, and the part (C) of FIG. 8 is a diagram showing an energy distribution in the longitudinal direction of the linear light spot.

FIG. 9 is a sectional view of a light beam non-uniform in intensity distribution in a direction in a plane perpendicular to the optical axis.

DETAILED DESCRIPTION OF EMBODIMENTS OF THE INVENTION

Figure 7:
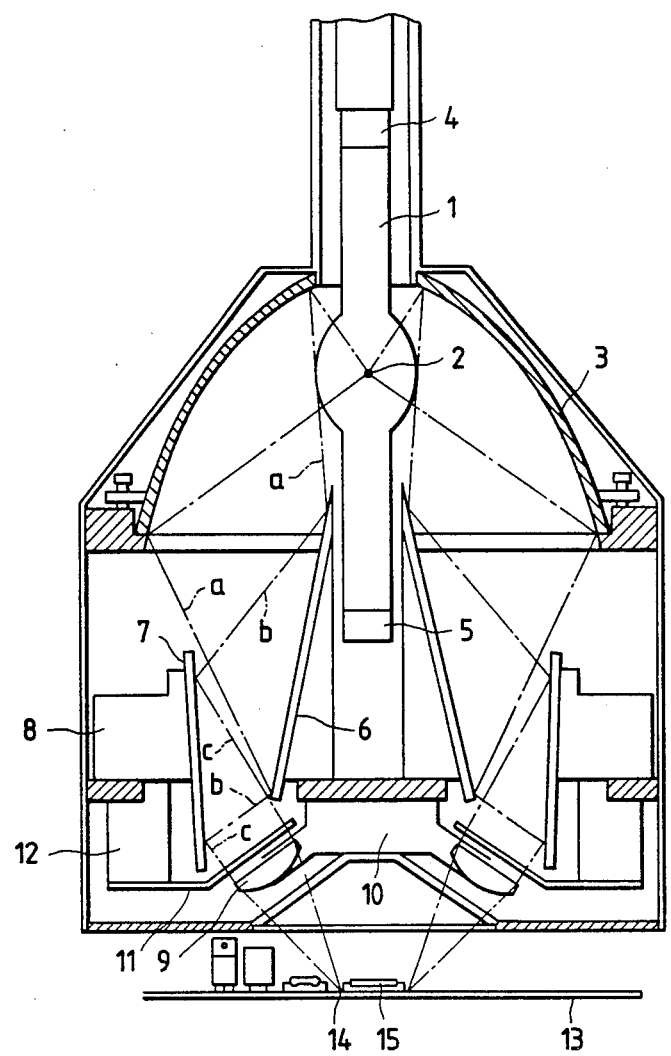
FIG. 7 shows the arrangement of a conventional light-beam-operated heating machine.

Preferred embodiments of this invention will be described with reference to the accompanying drawings in detail.

The technical concept of the invention is applied to a light-beam-operated heating machine such as is shown in FIG. 7. Its specific feature resides in a light concentrating optical system by which a light beam, non-uniform in intensity distribution in one direction in a plane which is perpendicular to the optical axis O as shown in FIG. 9, is applied as a linear light spot 14 on the printed circuit board 13.

In one embodiment of the invention, an optical component forming the light concentrating optical system, as shown in the parts (A) and (B) of FIG. 1 and FIG. 2, comprises a cylindrical lens portion 21 which is a unidirectional light concentrating means for concentrating an incident light beam into a linear light spot 14.; and a recess portion 22 with an arcuate surface having a predetermined radius which is formed in the incident surface thereof in such a manner as to have constant radius in the longitudinal direction of the cylindrical lens portion 21. In the optical component 20, the recessed portion 22 is a diffusing means for diffusing the incident light beam in the longitudinal direction of the cylindrical lens portion 21; i.e., in the direction (B—B in FIG. 9) in which the incident light beam is non-uniform in intensity distribution. Thus, the optical component 20 operates not only as the unidirectional light concentrating means for concentrating the incident light beam into the linear light spot 14, but also as the diffusing means for diffusing the incident beam in a direction perpendicular to the light concentrating direction.

With the optical component 20, the incident light beam is concentrated into a linear light spot or focused line of light while being diffused in a direction perpendicular to the light concentrating direction, whereby the difference in beam energy luminous intensity between the middle portion and the end portion of the linear light spot 14' is minimized, and the energy distribution is made more nearly uniform to the extent that it is substantially practical in use. The incident light beam is diffused in the longitudinal direction of the optical component 20 according to the invention. Therefore, the length of the long side of the linear light spot. which is, for instance, of the order of 28 mm in the prior art, is increased to about 36 mm in the invention. Accordingly, the area which can be heated and soldered is increased. Thus, even an electronic component having a number of terminals in one line, such as a large flat package IC, can be soldered by one radiation heating operation.

In the above-described embodiment, the recess portion 22 or the diffusing means, is integral with the cylindrical lens portion 21. However, as shown in FIG. 3, a diffusion lens 24 having a recess 22, and a cylindrical lens 21 may be formed separately. If in this case, the diffusion lens 24 is so designed as to be movable in the direction of its optical axis with respect to the cylindrical lens 21, then the composite focal point with the cylindrical lens 21 can be readily adjusted.

In the above-described embodiment, the diffusion means is the recess portion 22 having the arcuate surface which is constant in one direction; however, the surface configuration of the recess portion 22 is not limited thereto or thereby. That is, it may be a recess portion 22A which, as shown in the part (A) of FIG. 4, has arcuate surfaces which are not connected smoothly in one direction, or a recess portion 22B which, as shown in the part (A) of FIG. 5, has flat surfaces not connected smoothly in one direction or a recess portion 22C which, as shown in the part (A) of FIG. 6, has a parabolic surface. More specifically, the recess portion 22A, as shown in the part (A) of FIG. 4 has arcuate surfaces of the same radius which are not connected smoothly in a plane P perpendicular to the longitudinal direction of the optical components 20A and containing the optical axis 0, and which are symmetrical with the plane P. The recess portion 22B, as shown in the part (A) of FIG. 5, has flat surfaces which are not connected smoothly in the plane P and form the same angle with the optical axis O, and which are symmetrical with respect to the plane P. In the case of the part (A) of FIG. 6, the surface of the recess portion 22C is smoothly connected in the plane P. With those optical components, the energy distributions in the longitudinal directions of the linear light spots are as shown in the parts (B) of FIGS. 4, 5 and 6, respectively.

In the above-described embodiment, the single light beam from the light source is divided into four light beams in a plane perpendicular to the optical axis of the single light beam, and the four light beams thus formed are utilized to form four linear light spots; that is, four optical systems are formed. However, the number of such optical systems is not only limited to four. That is, the technical concept of the invention is applicable to a plurality of such optical systems the number of which corresponds to the number of portions which are to be treated by heating in one processing step as well as a single optical system.

In the light-beam-operated heating machine according to the invention, when at least one light beam, non-uniform in intensity distribution in one direction in a plane perpendicular to the optical axis, is concentrated in a direction perpendicular to the one direction to form a linear light spot, the light beam is diffused in the one direction by the diffusing means. As a result, the difference in beam energy luminous intensity in the longitudinal direction of the linear light spot is minimized, and accordingly, the energy distribution is made uniform to the extent that it is substantially practical in use; and in addition, the long side of the linear light spot is increased in length, which increases the area which can be subjected to radiation heating in one action.

What is claimed is:

1. In a light-beam-operated heating apparatus of the type in which at least one light beam, which is non-uniform in intensity along one axis in a plane perpendicular to the optical axis of the apparatus, is concentrated along a second axis perpendicular to and in the same plane as said one axis by a concentrator lens to form a line of light focused onto a workpiece said line of light having a longitudinal axis which is along said one axis and a width along said second axis, the improvement comprising:

light diffuser means comprising a diffuser lens positioned in the path of said beam of light for diffusing said beam along said one axis to reduce the non-uniformity of said intensity distribution.

2. The invention of claim 1 wherein said light diffuser means is positioned upstream of said concentrator lens with respect to said light beam.

3. The invention of claim 1, wherein said light diffuser lens has a surface which is at least substantially concave in cross section along said one axis and substantially flat in cross section along said second axis.

4. The invention in any of claims 1, 2 or 3, wherein said diffuser means and said concentrator lens are formed as an integral diffuser/concentrator lens.

5. The invention in any of claims 1, 2 or 3, wherein said apparatus is of the type having four such light beams, non-uniform in intensity along respective one axes in a plane perpendicular to the optical axis of said apparatus concentrated along respective second axes perpendicular to and in the same plane as said first axes by four respective concentrator lenses to form four lines of light focused onto respective work pieces, each said line of light having a longitudinal axis which is along a respective one axis and a width which is along a respective second axis, said improvement comprising four diffuser means positioned respectively in the paths of said beams of light for diffusing said beams along said respective one axes to reduce the non-uniformity of said intensity distribution.

* * * * *